United States Patent [19]
Utsumi et al.

[11] Patent Number: 6,091,310
[45] Date of Patent: Jul. 18, 2000

[54] MULTI-LAYER PRINTED BOARD WITH AN INDUCTOR PROVIDING A HIGH IMPEDANCE AT HIGH FREQUENCY

[75] Inventors: Kazuaki Utsumi; Shiro Yoshida; Mitsuo Saitou, all of Tokyo, Japan

[73] Assignee: NEC Corporation, Tokyo, Japan

[21] Appl. No.: 09/048,127

[22] Filed: Mar. 26, 1998

[30] Foreign Application Priority Data

Mar. 26, 1997 [JP] Japan ..................................... 9-073188

[51] Int. Cl.⁷ .............................. H05K 1/16; H05K 3/42; H05K 1/18
[52] U.S. Cl. ........................... 333/12; 333/181; 333/247; 361/761; 361/794; 336/200; 174/262
[58] Field of Search ............................. 333/12, 181, 246, 333/247, 185; 336/83, 200; 361/761, 765, 782, 811, 794; 174/262, 264, 265

[56] References Cited

U.S. PATENT DOCUMENTS

| 4,400,674 | 8/1983 | Suda et al. | 361/782 X |
| 5,384,434 | 1/1995 | Mandai et al. | 361/761 X |
| 6,002,593 | 12/1999 | Tohya et al. | 333/185 |

FOREIGN PATENT DOCUMENTS

| 2-100402 | 4/1990 | Japan | 333/246 |
| 3-160781 | 7/1991 | Japan | 361/782 |
| 4-273496 | 9/1992 | Japan | 333/246 |
| 10-303568 | 11/1998 | Japan . | |

*Primary Examiner*—Robert Pascal
*Assistant Examiner*—Barbara Summons

[57] ABSTRACT

A laminated multi-layer printed board having at least a power source circuit layer, at least a ground layer and at least a signal layer includes a hole which extends through the board to the power source circuit layer. An inductor is provided in the hole.

4 Claims, 5 Drawing Sheets

MULTI-LAYER PRINTED BOARD WITH AN INDUCTOR PROVIDING A HIGH IMPEDANCE AT HIGH FREQUENCY

BACKGROUND OF THE INVENTION

The present invention relates to a multi-layer printed board having integrated circuits or large scale integrated circuits.

The multi-layer printed board with integrated circuits or large scale integrated circuits is likely to generate electromagnetic noises which cause malfunctions of internal electronic elements such as transistors in the integrated circuits or the large scale integrated circuits or external electronic elements. The generation of the electromagnetic noises seems to be caused by electromagnetic radiation in a common mode due to a current caused by parasitic capacitance of the circuits and parasitic inductance thereof as well as due to a high frequency current flowing through a power supply line. The mechanism of generation of the electromagnetic noises is somewhat complicated, for which reason it was difficult to resolve the problems with generation of the noise. In the prior art, it was proposed to form magnetic films on both surfaces of the printed board for enabling the magnetic films to absorb the electromagnetic noises. This is disclosed in Japanese laid-open patent publication No. 6-244581. It was also proposed to form shielding layers on both surfaces of the printed board for enabling the shielding layers to shield the electromagnetic noises. This is disclosed in Japanese laid-open patent publication No. 6-244582. It was further proposed to form absorption layers on both surfaces of the printed board for enabling the absorption layers to absorb the electromagnetic noises. This is disclosed in Japanese laid-open patent publication No. 2-87593. The above conventional multi-layer printed boards as proposed are, however, incapable of suppressing the generation of the electromagnetic noises.

Still another conventional multi-layer printed board was proposed wherein a high voltage layer, a ground layer and a signal layer are laminated to be separated by insulation layers, which will be described with reference to FIG. 1A. A power is supplied through the high voltage layer to the integrated circuits or the large scale integrated circuits. An IC/LSI circuit 3 is connected between a high voltage line 22 through which a power is supplied from a power source to the IC/LSI circuit 3 and a ground line 23. A de-coupling capacitor 4 is also provided which is connected in parallel to the IC/LSI circuit 3 and between the high voltage line 22 and the ground line 23. A high frequency power source current flows through the high voltage line 22. The high frequency power source current is by-passed through the de-coupling capacitor 4. The de-coupling capacitor 4 also serves to suppress variation in potential of a power terminal of the IC/LSI circuit 3.

On the other hand, in the multi-layer printed board, a power supply layer serves as the power supply line 22 and comprises an electrically conductive layer which is flat, so as to ensure a large area for current flow thereby reducing a resistance of the power supply layer. The reduction in resistance of the power supply layer makes it easy to suppress the variation in voltage of the direct current power supply.

For the above conventional multi-layer printed board, it is difficult to control the high frequency power current flowing through the power source circuit layer with operations of the IC/LSI circuit. If the power source circuit layer is flat to reduce its impedance, then the high frequency power source current of the IC/LSI circuit will flow through not only the de-coupling capacitor of one of the IC/LSI circuits but also the other de-coupling capacitor of another IC/LSI circuit, for which reason the distribution of the high frequency power source current is complicated very much, resulting in difficulty in analyzing the distribution. This means that it is difficult to determine the capacitance of the de-coupling capacitors provided in individual IC/LSI circuits.

Since the power source circuit layer is flat and current paths of the high frequency power source current having flowed into the power source circuit layer are complicated. In a case, a large loop of current is formed, which irradiates an electromagnetic wave and deteriorates immunity of the circuit.

For example, as illustrated in FIG. 1B, there are provided three IC/LSI circuits 3C, 3D and 3E which are individually connected between a high voltage line 22 through which a power is supplied from a DC power source to the IC/LSI circuit 3C and a ground line 23. A de-coupling capacitor 4D with a large capacitance and a small impedance is connected in parallel to the IC/LSI circuit 3C and between the high voltage line 22 and the ground line 23. A de-coupling capacitor 4E with a middle capacitance and a middle impedance is connected in parallel to the IC/LSI circuit 3D and between the high voltage line 22 and the ground line 23. A de-coupling capacitor 4F with a small capacitance and a large impedance is connected in parallel to the IC/LSI circuit 3E and between the high voltage line 22 and the ground line 23. Since the de-coupling capacitor 4F connected in parallel to the IC/LSI circuit 3E has a large impedance, then the high frequency power source current from the IC/LSI circuit 3E is partially by-passed through the de-coupling capacitor 4F to the ground line 23 and remaining parts of the high frequency power source current from the IC/LSI circuit 3E may flow into the other IC/LSI circuits 3C and 3D. This results in enlargement in area of the current loop whereby the irradiated electromagnetic noises are increased and the immunity of the circuit is deteriorated. If, however, the high frequency power source current is not by-passed through the de-coupling capacitor connected in parallel to the IC/LIS circuit, then the high frequency power source current flows into the other current paths whereby the impedance of the current paths increases, resulting in an increased variation of the alternating current voltage. The large variation in the alternating current voltage might prevent the IC/LSI circuit from performing stable operations.

As described above, the above conventional multi-layer printed board is incapable of suppressing the generation of the electromagnetic noises. This means that the above conventional multi-layer printed board is incapable of complete shielding of the electromagnetic wave. It was proposed to accommodate the electronic component in a metal box in order to shield the electronic component from the electromagnetic noise. It is, however, required to form an opening in the metal box for an operational unit. The opening of the metal box allows a leakage of electronic noise.

Whereas it was proposed to form an inductor between the IC/LSI circuit and a power source circuit layer as illustrated in FIG. 2, wherein inductors 15 are provided on a surface of the multi-layer printed board so that the inductors 15 are connected through via holes 13 and through holes 14.

The above proposal for providing the inductors 15, however, results in the following problem. A distance between the power source layer 7 and the IC 3 is long, for which reason the generated noises are irradiated toward other signal lines. If, further, a chip inductor is provided on the printed board surface for every power source terminals of the integrated circuits, then this results in substantive reductions in free area of the printed board surface and in three-dimensional space in the multi-layer printed board. Such reductions render it difficult to provide via holes or through holes through which the chip inductors provided on the printed board surface are connected to the integrated circuits. Particularly, in the high frequency and high speed devices, several tens or a few hundred power source terminals are provided for every integrated circuit. This means it is difficult practically to provide, on the printed board surface, a large number of chip inductors individually correspondent to the power source terminals.

In the above circumstances, it had been required to develop a novel multi-layer printed board free from the above problems.

SUMMARY OF THE INVENTION

Accordingly, it is an object of the present invention to provide a novel multi-layer printed board free from the above problems.

It is a further object of the present invention to provide a novel multi-layer printed board which is capable of suppressing generation of the electromagnetic noises.

It is a still further object of the present invention to provide a novel multi-layer printed board which is capable of suppressing a high frequency power source current of an integrated circuit from flowing into a power source circuit layer.

It is yet a further object of the present invention to provide a novel multi-layer printed board which is capable of suppressing a high frequency power source current of an integrated circuit from flowing into a power source circuit layer.

The above and other objects, features and advantages of the present invention will be apparent from the following descriptions.

The present invention provides a multi-layer printed board having at least a power source circuit layer, at least a ground layer and at least a signal layer which are laminated through insulation films, the multi-layer printed board also having at least a hole which extends to the power source circuit layer, wherein an inductor is provided in the hole.

BRIEF DESCRIPTION OF THE DRAWINGS

Preferred embodiments according to the present invention will be described in detail with reference to the accompanying drawings.

DESCRIPTION OF THE PREFERRED EMBODIMENT

Figure 1A:
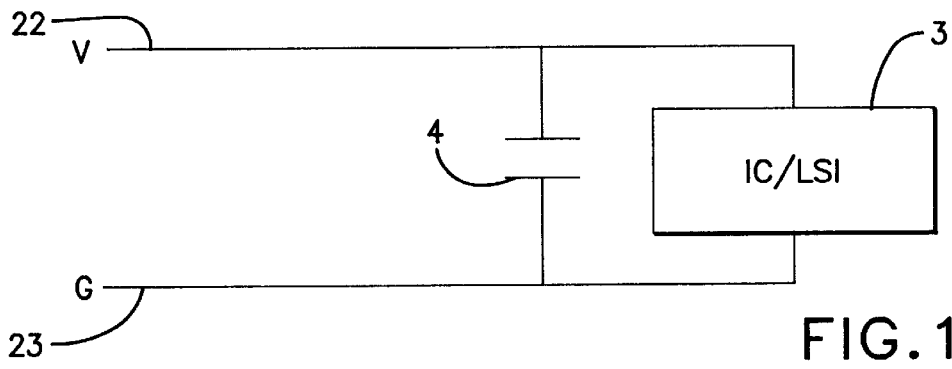
FIG. 1A is a block diagram illustrative of the conventional power source circuit provided on the conventional multi-layer printed board.
Figure 1B:
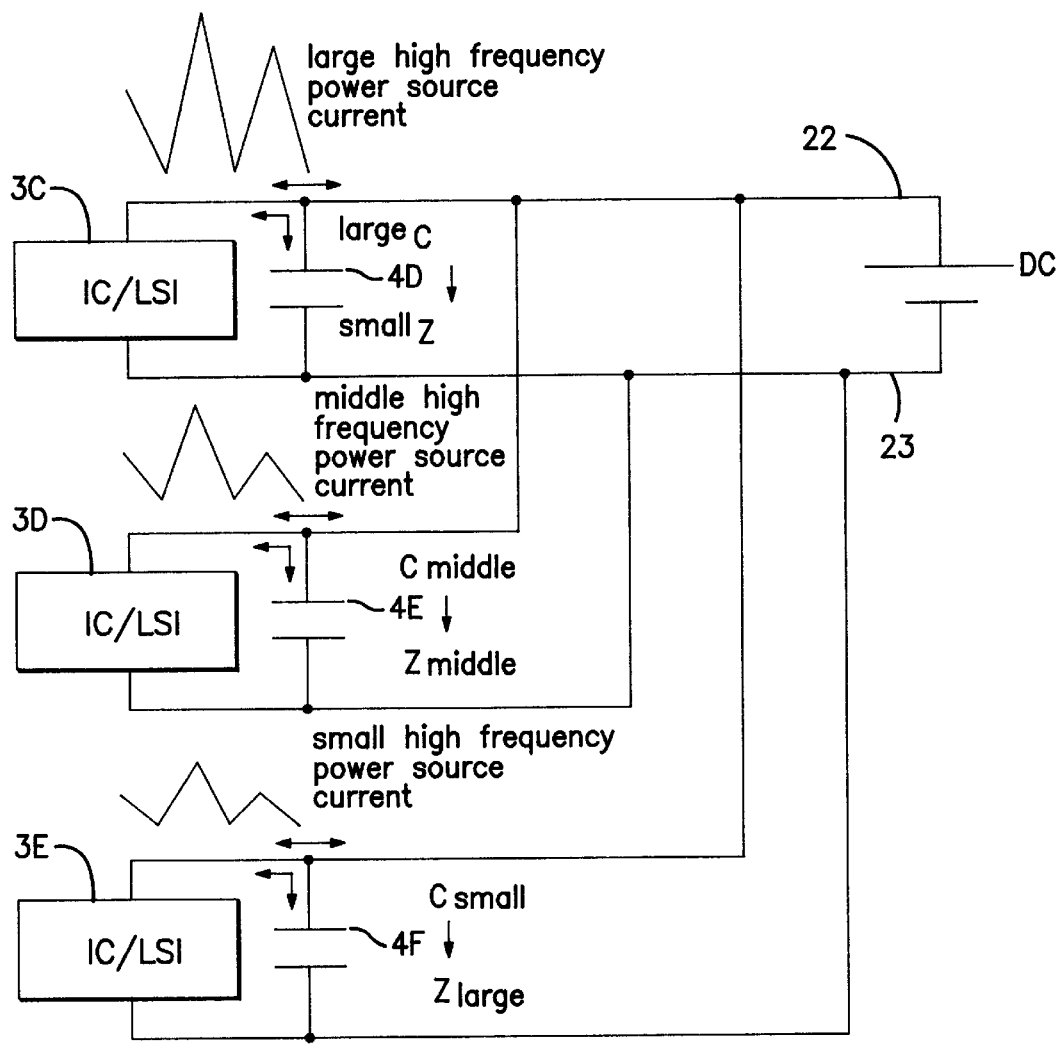
FIG. 1B is a block diagram illustrative of the other conventional power source circuit provided on the other conventional multi-layer printed board.
Figure 2:
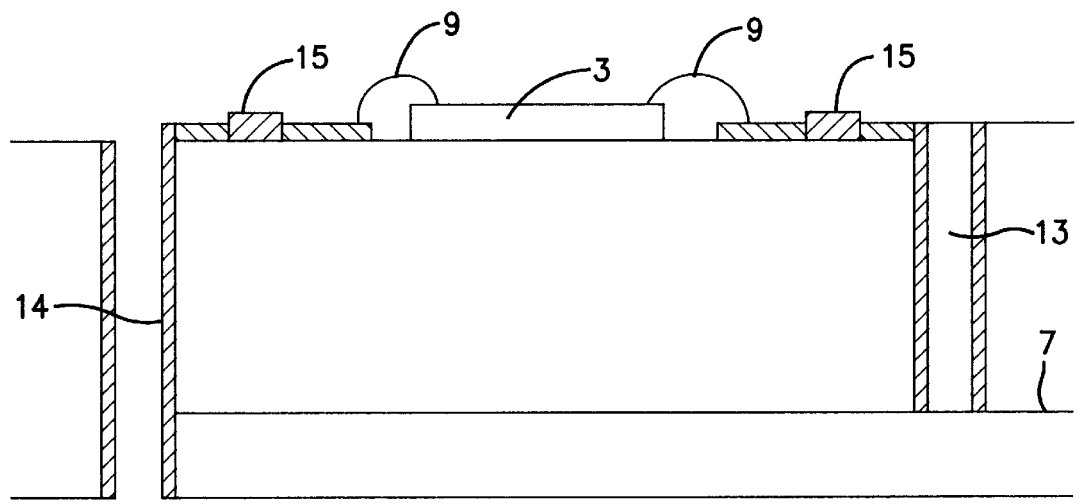
FIG. 2 is a fragmentary cross sectional elevation view illustrative of a conventional multi-layer printed board on which an IC/LSI circuit is provided.

The present invention provides a multi-layer printed board having at least a power source circuit layer, at least a ground layer and at least a signal layer which are laminated through insulation films, the multi-layer printed board also having at least a hole which extends to the power source circuit layer, wherein an inductor is provided in the hole It is preferable that the inductor has a conductive material which extends on an inner wall of the hole in the form of helix.

It is also preferable that the inductor comprises a magnetic material filled in the hole.

It is also preferable that the inductor comprises an electrically conductive material filled within the hole and the electrically conductive material has a helical cutting edge.

It is also preferable that a magnetic material is provided in the helical cutting edge of the electrically conductive material.

It is also preferable that the inductor comprises a magnetic material filled within the hole and the magnetic material has a helical cutting edge, and that an electrically conductive material is provided in the helical cutting edge of the magnetic material.

It is also preferable that the inductor comprises an electrically conductive material filled within the hole and the magnetic material has a helical cutting edge, and that a magnetic material is provided in the helical cutting edge of the electrically conductive material.

It is also preferable that the inductor comprises a chip inductor.

It is also preferable that the inductor comprises a coil.

It is also preferable that a plurality of the signal layers are provided and wherein a plurality of via holes are formed which extend between short interconnections on the signal layers so that a series connection of the via holes, the short interconnections form a continuous coil.

it is also preferable that the power source circuit layer is sandwiched between insulation films which are disposed between two of the ground layers. In this case, it is also preferable that the ground layers are flat and free of any other hole other than via hole and through hole and also free of independent interconnections. Further, it is also preferable that the power source circuit layer has an impedance adding circuit in the form of interconnections.

It is also preferable that a plurality of the signal layers are provided and wherein a plurality of via holes are formed which extend between short interconnections on the signal layers so that a series connection of the via holes, the short interconnections form a continuous coil. In this case, it is also preferable that the power source circuit layer has an impedance adding circuit in the form of interconnections.

The present invention provides a method of forming an inductor in a hole of a multi-layer printed board having at least a power source circuit layer, at least a ground layer and at least a signal layer which are laminated through insulation films. The hole extends to the power source circuit layer. The method comprises the steps of forming a conductive film on an entire inner wall of the hole, and selectively etching the conductive film to form a helical conductive film.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the steps of forming a conductive film on an entire inner wall of the hole, and filling a magnetic material within the hole.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the steps of filling an electrically conductive material within the hole, and forming a cutting edge on the electrically conductive material in the form of a helical.

It is further preferable further comprises a step of filling the cutting edge with a magnetic material.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises. The method comprises the steps of filling a magnetic material within the hole, forming a cutting edge on the magnetic material in the form of a helical, and filling the cutting edge with an electrically conductive material.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the steps of filling an electrically conductive and magnetic material within the hole, and forming a cutting edge on the electrically conductive and magnetic material in the form of a helical.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the step of inserting a chip inductor into the hole.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the step of:

inserting a coil into the hole.

The present invention also provides a method of forming an inductor in a hole of a multi-layer printed board having at least a power source circuit layer, at least a ground layer and at least a signal layer which are laminated through insulation films. The hole extends to the power source circuit layer. The method comprises the steps of forming a plurality of short power source interconnections on the signal layers, and connecting the plurality of short power source interconnections on the signal layers to each other by holes to form a series connection in the form of a coil.

The present invention will be described in detail with reference to FIG. 3 which is illustrative of a novel multi-layer printed board with inductors provided in a via hole and a through hole and with IC/LSI circuits. The multi-layer printed board has a lamination structure as illustrated in FIG. 4. The lamination structure has a first signal layer 5-1, a first ground layer 6-1 laminated over an insulation film 8 over the first signal layer 5-1, a first power source circuit 7-1 laminated over an insulation film over the first ground layer 6-1, a second ground layer 6-2 laminated over an insulation film over the first power source circuit 7-1, a second signal layer 5-2 laminated over an insulation film over the second ground layer 6-2, a third signal layer 5-3 laminated over an insulation film over the second signal layer 5-2, a third ground layer 6-3 laminated over an insulation film over the third signal layer 5-3, and a fourth signal layer 5-4 laminated over an insulation film over the third ground layer 6-3. The power source circuit layer 7-1 is disposed between the first and second ground layers 6-1 and 6-2. The ground layers are flat and free of through holes and via holes as well as free of interconnections. This structure is preferable to ensure a shortest return path through which the returning signals are transmitted.

Figure 3:
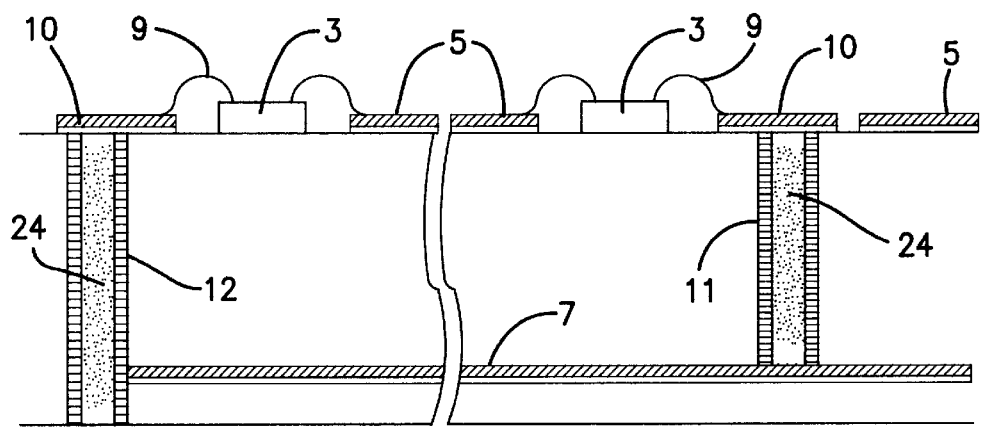
FIG. 3 is a fragmentary cross sectional elevation view illustrative of a novel multi-layer printed board on which ICILSI circuits are provided in accordance with the present invention.
Figure 4:
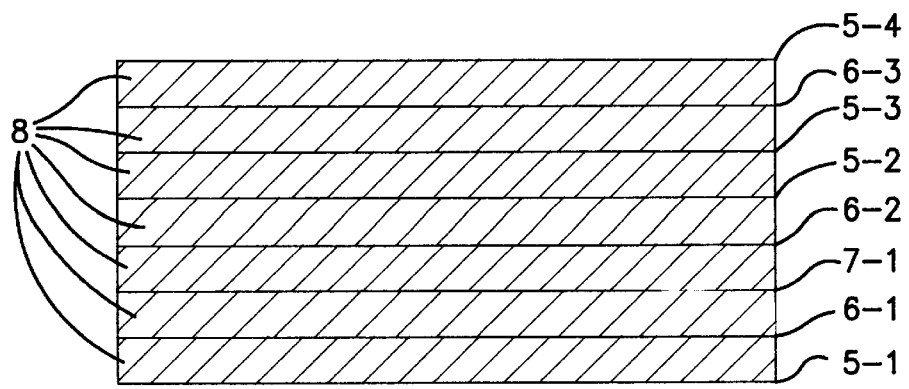
FIG. 4 is a fragmentary cross sectional elevation view illustrative of a multi-layer structure of a novel multi-layer printed board in accordance with the present invention.

With reference to FIG. 3, integrated circuits 3 are provided on the surface of the multi-layer printed board. Each of the integrated circuits 3 is connected through wirings 9 to signal layers 5 and pads 10. The multi-layer printed board has a via hole 11 and a through hole 12 so that the pads 10 are positioned over the via hole 11 and the through hole 12. Inductors 24 are provided in the via hole 11 and the through hole 12 so that the pads 10 are electrically connected with the inductors 24. Further, the via hole 11 and the through hole 12 extend to reach the power source circuit layer 7. As a result, the integrated circuits 3 are then electrically connected to the power source circuit 7 through the wirings 9, the pads 10 and the via hole 11 or the through hole 12. The provision of the inductors 24 in the via hole 11 and the through hole 12 results in increase in high frequency impedance without increase in direct current resistance to the circuit whereby the high frequency noises are prevented from reaching the power source circuit layer.

Figure 5:
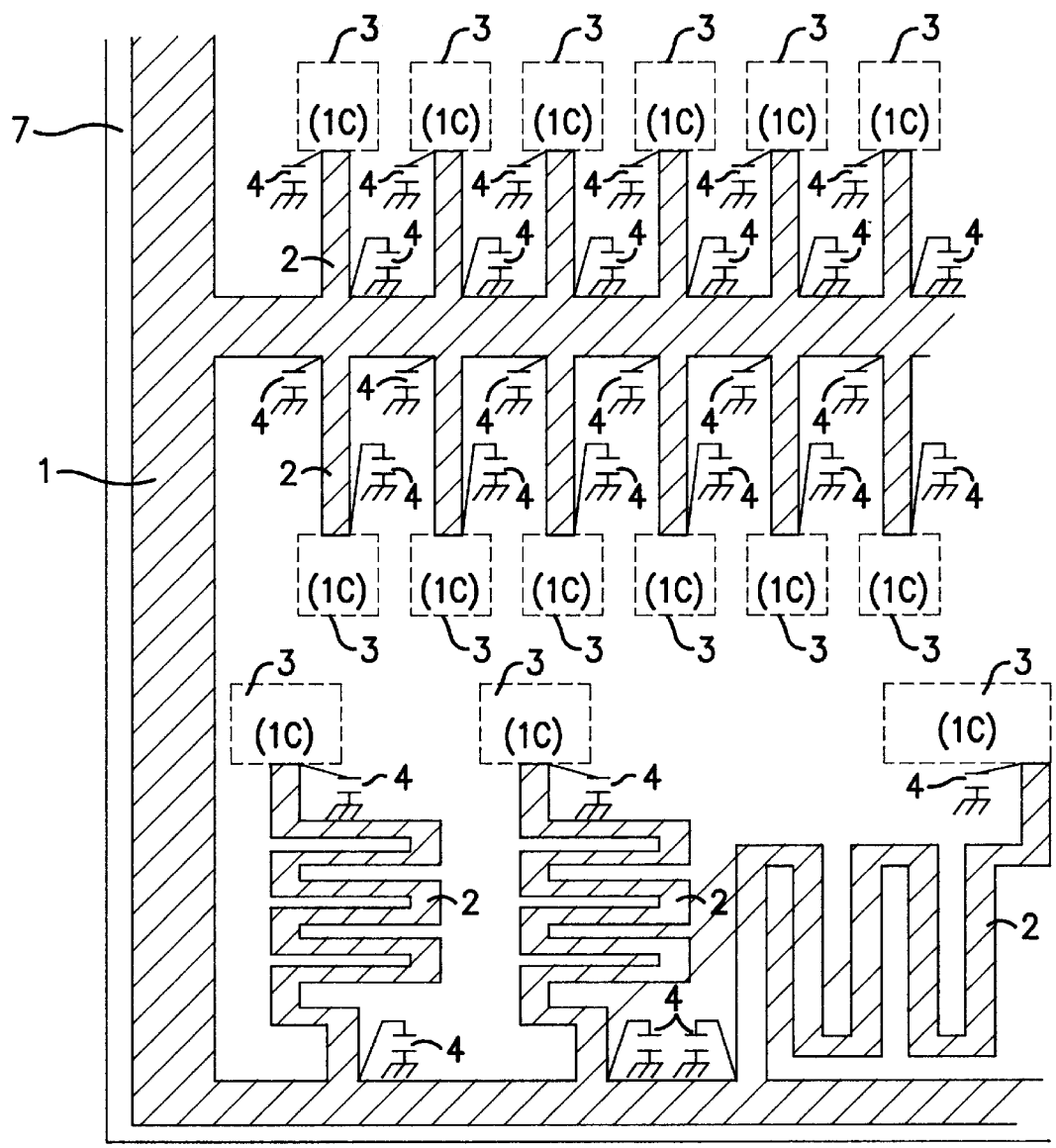
FIG. 5 is a fragmentary plan view illustrative of a power source circuit layer of a novel multi-layer printed board in accordance with the present invention.

With reference to FIG. 5, the power source circuit layer 7 has a main interconnection 1 and branch interconnections 2 extending from the main interconnection 1. The main interconnection 1 is provided to suppress the direct current voltage drop and also to distribute the direct current entirely to the printed board. The branch interconnections are provided to isolate individual circuits under high frequency conditions and also to increase the high frequency impedance. The branch interconnections 2 provides longer current paths than when straight lines simply connecting two points are provided. For this reason, the provision of the branch interconnections 2 increases inductance of the circuit. This means that the branch interconnections 2 may serve to provide an impedance to the circuit.

The provisions of both the inductors in the via hole or the through hole and also of the impedance adding circuit in the power source circuit layer do efficiently suppress the phenomenon that the high frequency noise generated from the circuits reaches to the other circuits. The provisions of the inductors and the impedance adding circuit also allow a designer to determine with large freedom current paths. Such provisions further allow the designer to determine optimum de-coupling capacitors for individual integrated circuits.

In accordance with the present innovation, the inductors are formed in via holes and through holes which are connected to the power source layer which increases the high frequency impedance whereby the high frequency power source current due to the operations of the integrated circuits is suppressed from flowing into the de-coupling capacitors.

It is possible to determine the optimum de-coupling capacitor for every integrated circuit whereby the variation in alternating current voltage of the integrated circuits can be reduced, resulting in stable operation of the integrated circuit.

FIRST EMBODIMENT

Figure 6:
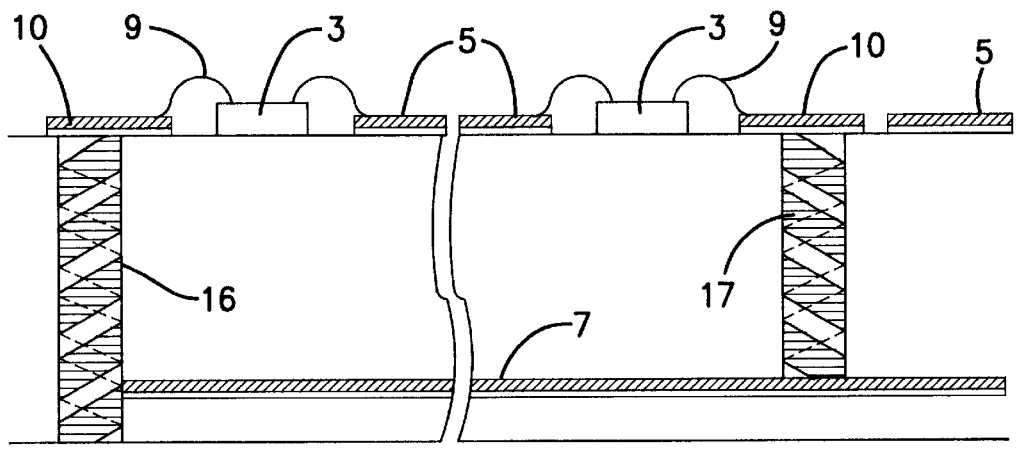
FIG. 6 is a fragmentary cross sectional elevation view illustrative of a novel multi-layer printed board with inductors formed in through holes or via holes in a first embodiment in accordance with the present invention.

A first embodiment according to the present invention will be described in detail with reference to FIG. 6 which is illustrative of a novel multi-layer printed board with inductors provided in a via hole and a through hole and with IC/LSI circuits. Integrated circuits 3 are provided on the surface of the multi-layer printed board. Each of the integrated circuits 3 is connected through wirings 9 to signal layers 5 and pads 10. The multi-layer printed board has a via hole 17 and a through hole 16 so that the pads 10 are positioned over the via hole 17 and the through hole 16. Inductors are provided in the via hole 17 and the through hole 16 so that the pads 10 are electrically connected with the inductors. Each of the inductors comprises a helical conductor which helically extends on inner walls of the via hole 17 and the through hole. The inner spaces of the via hole 17 and the through hole 16 may be filled with an organic insulation material. It is, however, preferable that a magnetic material such as ferrite is filled within the inner spaces of the via hole 17 and the through hole 16. The above helical conductor may be formed as follows. A conductor is entirely formed on the inner wall of the through hole 16 or the via hole 17 by electroless plating method before the conductor is helically etched by a jig like a tap. Further, the via hole 17 and the through hole 16 extend to reach the power source circuit layer 7. As a result, the integrated circuits 3 are then electrically connected to the power source circuit 7 through the wirings 9, the pads 10 and the via hole 17 or the through hole 16. The provision of the helical inductors in the via hole 17 and the through hole 16 results in increase in high frequency impedance without increase in direct current resistance to the circuit whereby the high frequency noises are prevented from reaching the power source circuit layer.

SECOND EMBODIMENT

Figure 7:
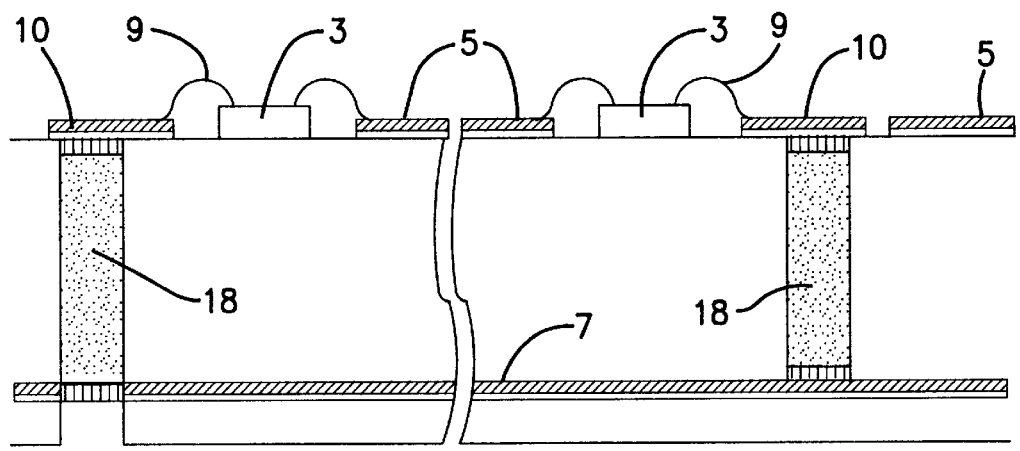
FIG. 7 is a fragmentary cross sectional elevation view illustrative of a novel multi-layer printed board with inductors formed in through holes or via holes in a second embodiment in accordance with the present invention.

A second embodiment according to the present invention will be described in detail with reference to FIG. 7 which is illustrative of a novel multi-layer printed board with inductors are provided in a via hole and a through hole and with IC/LSI circuits. Integrated circuits 3 are provided on the surface of the multi-layer printed board. Each of the integrated circuits 3 is connected through wirings 9 to signal layers 5 and pads 10. The multi-layer printed board has a via hole and a through hole so that the pads 10 are positioned over the via hole and the through hole. Chip inductors 18 are provided in the via hole and the through hole so that the pads 10 are electrically connected with the inductors. Each of the chip inductors 18 may be of a winding type, a thick film type or a thin film type. Any other chip inductor that provides the required inductance characteristics may be used. The integrated circuits 3 are then electrically connected to the power source circuit 7 through the wirings 9, the pads 10 and the via hole or the through hole. The provision of the inductors in the via hole and the through hole results in increase in high frequency impedance without increase in direct current resistance to the circuit whereby the high frequency noises are prevented from reaching the power source circuit layer.

THIRD EMBODIMENT

Figure 8:
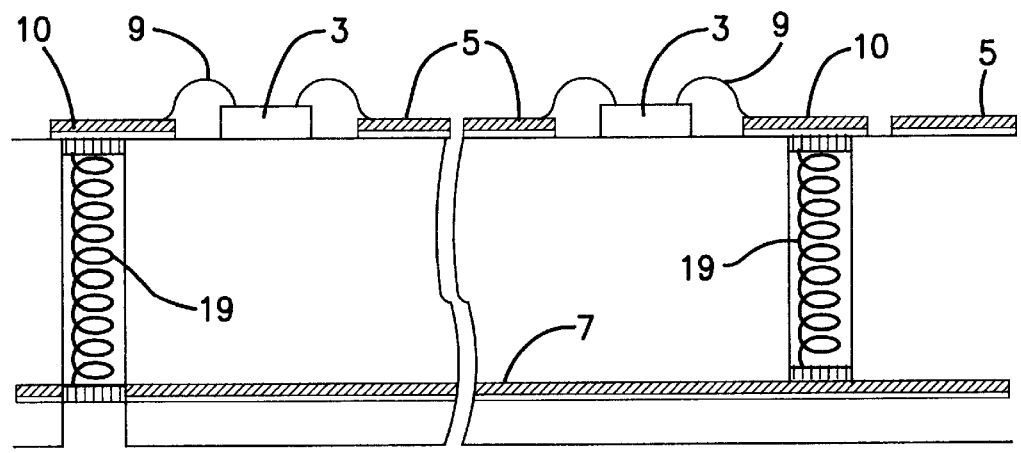
FIG. 8 is a fragmentary cross sectional elevation view illustrative of a novel multi-layer printed board with inductors formed in through holes or via holes in a third embodiment in accordance with the present invention.

A third embodiment according to the present invention will be described in detail with reference to FIG. 8 which is illustrative of a novel multi-layer printed board with inductors are provided in a via hole and a through hole and with IC/LSI circuits. Integrated circuits 3 are provided on the surface of the multi-layer printed board. Each of the integrated circuits 3 is connected through wirings 9 to signal layers 5 and pads 10. The multi-layer printed board has a via hole and a through hole so that the pads 10 are positioned over the via hole and the through hole. Coil inductors 19 are provided in the via hole and the through hole so that the pads 10 are electrically connected with the inductors 19. Alternatively, it is possible that the through hole or the via hole is filled with an electrically insulative magnetic material so that a helical cutting edge is put on the magnetic material by a tap before a conductive material is injected into the hole. Further alternatively, it is possible that an electrically conductive magnetic material is filled into the through hole or the via hole so that a helical cutting edge is put on the magnetic material by a tap. The integrated circuits 3 are then electrically connected to the power source circuit 7 through the wirings 9, the pads 10 and the via hole or the through hole. The provision of the inductors in the via hole and the through hole results in increase in high frequency impedance without increase in direct current resistance to the circuit whereby the high frequency noises are prevented from reaching the power source circuit layer.

FOURTH EMBODIMENT

Figure 9:
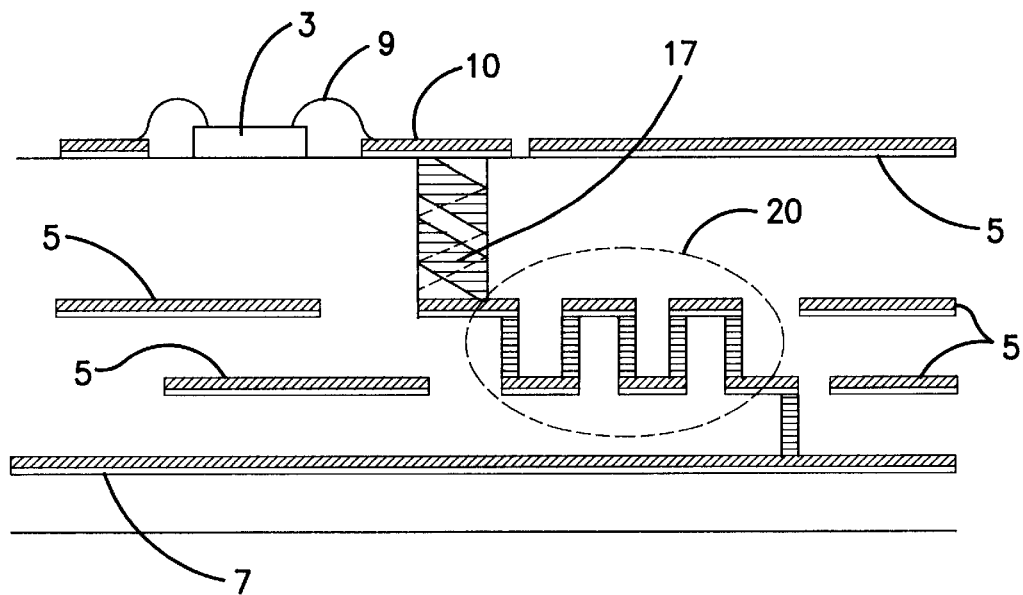
FIG. 9 is a fragmentary cross sectional elevation view illustrative of a novel multi-layer printed board with inductors formed in through holes or via holes in a fourth embodiment in accordance with the present invention.

A fourth embodiment according to the present invention will be described in detail with reference to FIG. 9 which is illustrative of a novel multi-layer printed board with inductors are provided in a via hole and a through hole and with IC/LSI circuits. Integrated circuits 3 are provided on the surface of the multi-layer printed board. Each of the integrated circuits 3 is connected through wirings 9 to signal layers 5 and pads 10. The multi-layer printed board has top and bottom signal layers 5 having a plurality of short interconnections. A plurality of small via holes are provided which extend in a vertical direction so that the small via holes connect between the short interconnections of the top and bottom signal layers 5 respectively, thereby to form an inductor 20 which comprises the top and bottom signal layers 5 and the via holes. The above connections of the top and bottom signal layers through the small via holes may be regarded as a coil inductor. A large inductor is also provided, which vertically extend between the pad 10 and the signal layer 5, wherein the large inductor has a helical conductor 17. The integrated circuit 3 is then electrically connected to the power source circuit 7 through the wirings 9, the pads 10 and the via hole or the through hole. The provision of the inductors in the via hole and the through hole results in increase in high frequency impedance without increase in direct current resistance to the circuit whereby the high frequency noises are prevented from reaching the power source circuit layer.

FIFTH EMBODIMENT

Figure 10:
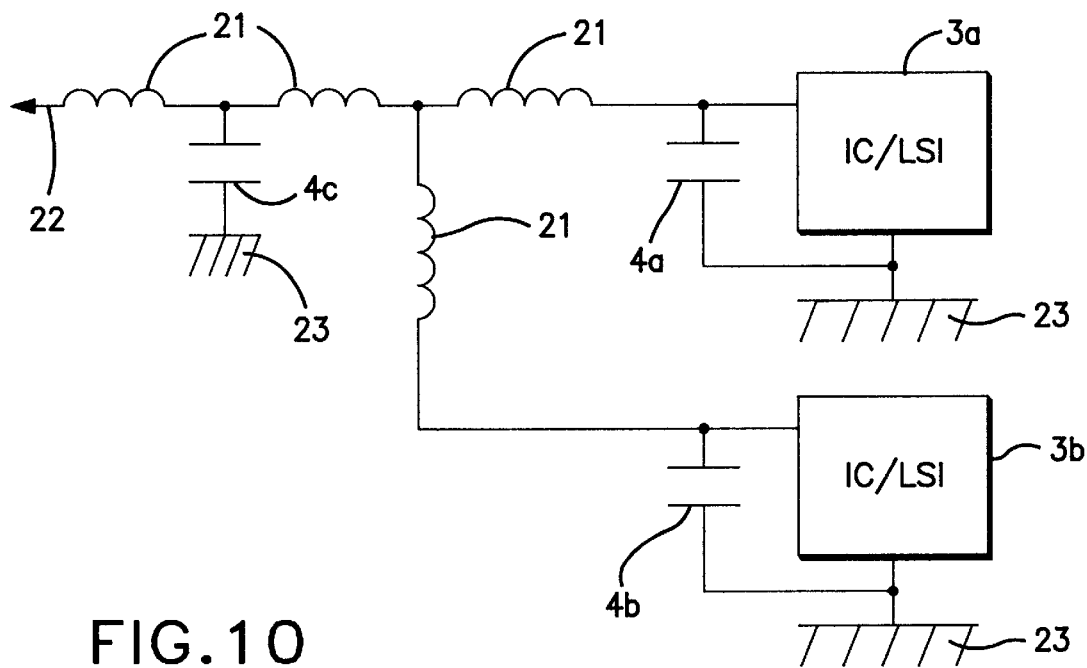
FIG. 10 is a block diagram illustrative of a power source circuit provided on a novel multi-layer printed board in accordance with the present invention.

A fifth embodiment according to the present invention will be described in detail with reference to FIG. 10. On the multi-layer printed board as described above, the integrated circuits 3a and 3b are provided so as to be commonly connected between the power supply line 22 and ground 23. Two de-coupling capacitors 4a and 4b are provided for the two integrated circuits 3a and 3b respectively. The power source circuits are commonly connected to a third de-coupling capacitor 4c. The inductors are formed in the through holes and via holes which connect the power source circuit layer 7 and the integrated circuit to ensure a distributed inductance 21.

This distributed inductance 21 and the de-coupling capacitors 4a, 4b and 4c form a filter circuit whereby the high frequency power source current is prevented from flowing into the power supply line. The distributed inductance 21 is controllable whereby the filter constant of the filter circuit is also controllable.

The high frequency power source current flowing into the power supply line 22 through the de-coupling capacitors 4a and 4b is remarkably reduced, whereby the electromagnetic radiation from the multi-layer printed board can be suppressed. This means it possible to suppress the radiation of the electromagnetic wave.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuit board comprising:
   a laminate of a power layer, a ground layer, and a plurality of signal layers, each of said power, ground, and signal layers being separated from an adjacent one of said power, ground and signal layers by an insulation layer, wherein at least two of said signal layers each comprises plural separate segments;
   plural electrically conductive first vias through the insulation layer between said at least two signal layers, each of said first vias connecting one of said segments in one of said at least two signal layers to one of said segments in another of said at least two signal layers, wherein a series connection of said plural first vias and plural said segments in each of said at least two signal layers is a continuous coil; and
   a second via with an inductor therein that connects said continuous coil to a contact pad on the circuit board and an electrically conductive third via that connects said continuous coil to said power layer.

2. The circuit board of claim 1, wherein said inductor comprises an electrically conductive helix that connects said contact pad to said continuous coil.

3. A circuit board comprising:
   a contact pad on a surface of the circuit board;
   a horizontally disposed laminate comprising a power layer and a plurality of signal layers, each of said power and signal layers being separated from an adjacent one of said power and signal layers by an insulation layer, wherein at least two of said signal layers each comprises plural separate segments;
   plural electrically conductive first vias extending vertically through the insulation layer between said at least two signal layers, each of said first vias connecting one of said segments in one of said at least two signal layers to one of said segments in another of said at least two signal layers, wherein a series connection of said plural first vias and plural said segments in each of said at least two signal layers is a horizontally disposed continuous coil;
   an electrically conductive second via that comprises a vertically aligned helix that connects said continuous coil to said contact pad; and
   an electrically conductive third via that connects said continuous coil to said power layer.

4. A circuit board comprising:
   a laminate of a power layer, two ground layers, and a signal layer, each of said power, ground, and signal layers being separated from an adjacent one of said power, ground, and signal layers by an insulation layer, said power layer being sandwiched between two of said insulation layers, and said two insulation layers sandwiching said power layer being sandwiched between said two ground layers,
   said power layer comprising a main interconnection, circuit elements, and an impedance adding circuit, said impedance adding circuit comprising branch interconnections connecting said main interconnection to said circuit elements, each of said branch interconnections having a current path that is longer than a straight line connection between said main interconnection and a respective one of said circuit elements; and
   at least one via extending from an exterior surface of said laminate to said power layer, and an inductor in said via.

* * * * *